United States Patent
Tsai et al.

(10) Patent No.: US 10,672,969 B2
(45) Date of Patent: Jun. 2, 2020

(54) THERMOCOUPLE DEVICE

(71) Applicant: Taiwan Semiconductor Manufacturing Co., Ltd., Hsin-Chu (TW)

(72) Inventors: Ming-Hsien Tsai, Hsinchu (TW); Shang-Ying Tsai, Pingzhen (TW); Fu-Lung Hsueh, Kaohsiung (TW); Shih-Ming Yang, Tainan (TW); Jheng-Yuan Wang, Taichung (TW); Ming-De Chen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 280 days.

(21) Appl. No.: 15/637,900

(22) Filed: Jun. 29, 2017

(65) Prior Publication Data
US 2019/0006571 A1 Jan. 3, 2019

(51) Int. Cl.
*H01L 35/32* (2006.01)
*H01L 35/34* (2006.01)
*H01L 35/04* (2006.01)
*H01L 35/22* (2006.01)

(52) U.S. Cl.
CPC .......... *H01L 35/32* (2013.01); *H01L 35/04* (2013.01); *H01L 35/22* (2013.01); *H01L 35/34* (2013.01)

(58) Field of Classification Search
CPC ......... H01L 35/00; H01L 35/02; H01L 35/04; H01L 35/12; H01L 35/14
See application file for complete search history.

(56) References Cited

U.S. PATENT DOCUMENTS

| 6,818,470 B1 | 11/2004 | Acklin et al. |
| 7,312,392 B2 | 12/2007 | Yotsuhashi et al. |
| 7,421,845 B2* | 9/2008 | Bell ............... F02G 1/043 62/3.2 |
| 8,304,851 B2 | 11/2012 | Trifonov |
| 2007/0095381 A1 | 5/2007 | Lee |
| 2011/0132422 A1* | 6/2011 | Yajima ............ H01L 35/32 136/211 |

OTHER PUBLICATIONS

Yang, S.M. et al., "Application of quantum well-like thermocouple to thermoelectric energy harvester by BiCMOS process", Sensors and Actuators A: Physical, 2011, 166:117-124.
Xie, J. et al., "Design, Fabrication, and Characterization of CMOS MEMS-Based Thermoelectric Power Generators", Journal of Microelectromechanical Systems, 2010, 19:317-324.
(Continued)

*Primary Examiner* — Christina Chern
(74) *Attorney, Agent, or Firm* — Duane Morris LLP

(57) ABSTRACT

A semiconductor device includes a substrate; a first thermoelectric conduction leg, disposed on the substrate, and doped with a first type of dopant; a second thermoelectric conduction leg, disposed on the substrate, and doped with a second type of dopant, wherein the first and second thermoelectric conduction legs are spatially spaced from each other but disposed along a common row on the substrate; and a first intermediate thermoelectric conduction structure, disposed on a first end of the second thermoelectric conduction leg, and doped with the first type of dopant.

20 Claims, 16 Drawing Sheets

(56) References Cited

OTHER PUBLICATIONS

Strasser, M. et al., "Micromachined CMOS Thermoelectric Generators as on-chip Power Supply", 12th International Conference on Solid State Sensors, Actuators and Microsystems, 2003, 1B3.3;pp. 45-48.
Kim, S. et al., "A wearable thermoelectric generator fabricated on a glass fabric", Energy & Environmental Science, 2014, 7.6:1959-1965.
Akyildiz, I. et al., "A survey on sensor networks", IEEE Communications Magazine, 2002, 40(8):102-114.
Barnhart, D et al., "Very-small-satellite design for distributed space missions", Journal of Spacecraft and Rockets, 2007, 44.6:1294-1306.

* cited by examiner

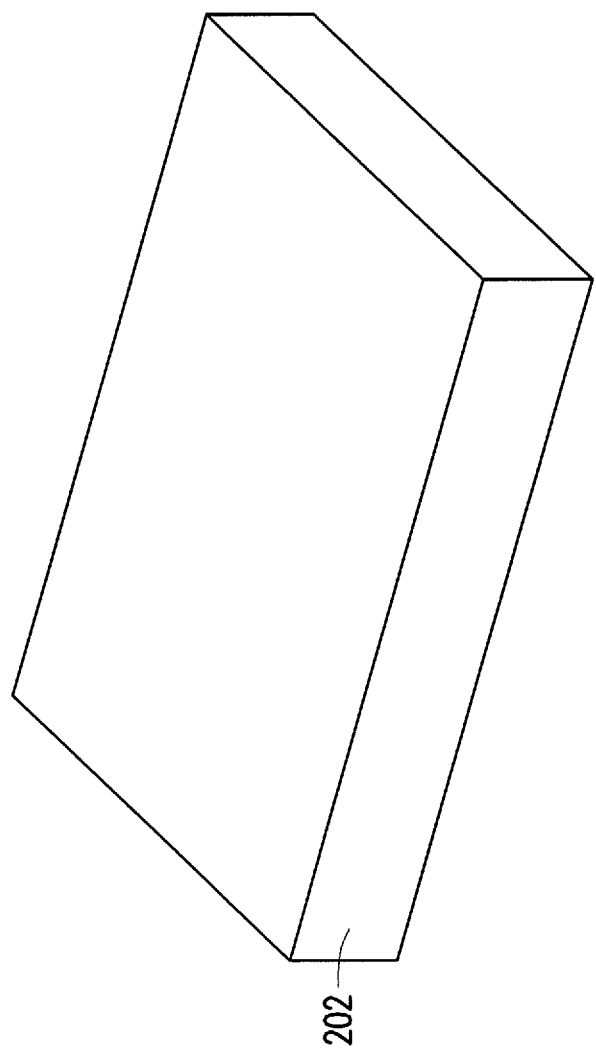

THERMOCOUPLE DEVICE

BACKGROUND

Thermoelectric power generation is a technique for converting thermal energy into electric energy with the use of the "Seeback effect." The Seeback effect is a phenomenon in which a temperature difference given to opposing ends of a substance causes a thermal electromotive force in proportion to the temperature difference, whereby electric power (e.g., a current or a voltage signal) can be taken out by externally coupling a load to the substrate. Devices operating based on such a technique (thermoelectric power generation) have been seen in various applications such as, for example, wearable electronics, wireless sensor networks, system on chip circuits, etc.

In some cases, a thermocouple device, made of either conductor or semiconductor material, can be placed across a temperature difference to generate electric power based on the above-described technique. Generally, when the temperature difference is provided across respective ends of the thermocouple device, which are typically referred to as hot and cold ends, respectively, a voltage (or current) signal (i.e., the electric power) can be measured therebetween. Such a thermocouple device is typically categorized as one of various thermoelectric energy generation (TEG) devices. In accordance with increasing needs for a high-performance and CMOS-compatible thermocouple device (e.g., a miniature size, low heat leakage, a reliable durability, etc.), various, material- and/or structure-wise, types of thermocouple devices have been proposed to further improve performance of existing thermocouple devices. However, such known thermocouple devices have not been entirely satisfactory in order to provide desired performance while being able to be fabricated using CMOS-compatible technologies.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 2A, 2B, 2C, 2D, 2E, 2F, 2G, 2H, and 2J illustrate perspective views of an exemplary thermocouple device, made by the method of FIG. 1, during various fabrication stages, in accordance with some embodiments.

DETAILED DESCRIPTION OF EXEMPLARY EMBODIMENTS

Figure 1:
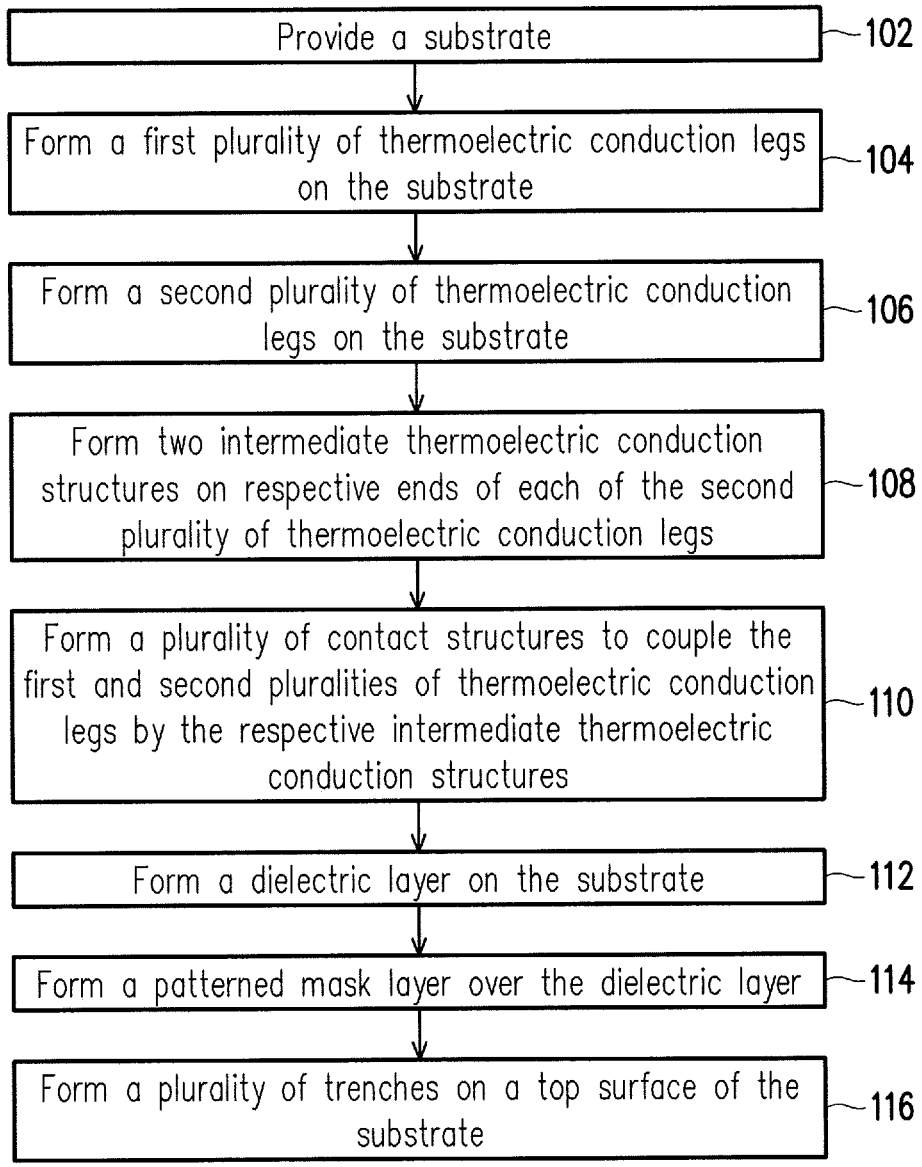
FIG. 1 illustrates a flow chart of an embodiment of a method to form a thermocouple device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel thermocouple device and method of forming the same. In some embodiments, the thermocouple device includes a plurality of pairs of thermoelectric conduction legs, wherein the thermoelectric conduction legs of each pair are formed of respective semiconductor materials and with respective different dopant types. The thermoelectric conduction legs of each pair are coupled to each other at respective ends so as to form a plurality of sub thermocouple devices that are each formed by two respective thermoelectric conduction legs coupled to each other in series, and each with a respective dopant type. In some embodiments, the plural sub thermocouple devices (i.e., the plural pairs of thermoelectric conduction legs) are disposed in parallel on a substrate with respective thermoelectric conduction legs being alternatively arranged in terms of the dopant type. Further, the plural sub thermocouple devices may be physically coupled to one another through one or more conductor structures. As such, the plurality of sub thermocouple devices may be "electrically" coupled in series when a current/voltage signal is generated from each sub thermocouple device. In some embodiments, a trench may be formed on a top surface of the substrate and between two adjacent thermoelectric conduction legs that each belongs to a respective sub thermocouple device. Such a trench may further improve an insulation characteristic of the disclosed thermocouple device, which advantageously decreases respective heat leakage.

FIG. 1 illustrates a flowchart of a method 100 to form a thermocouple device according to one or more embodiments of the present disclosure. It is noted that the method 100 is merely an example, and is not intended to limit the present disclosure. As employed by the present disclosure, the thermocouple device refers to any device that can produce electric power by using a temperature difference across respective ends of the device. It is noted that the method of FIG. 1 does not produce a completed thermocouple device. Accordingly, it is understood that additional operations may be provided before, during, and after the method 100 of FIG. 1, and that some other operations may only be briefly described herein.

In some embodiments, the method 100 starts with operation 102 in which a substrate is provided. The method 100 continues to operation 104 in which a first plurality of thermoelectric conduction legs are formed on the substrate. In some embodiments, the first plurality of thermoelectric conduction legs are each formed of an n-type polysilicon material. In some embodiments, the first plurality of thermoelectric conduction legs are aligned along a respective row. And two of the first plurality of thermoelectric conduction legs that are respectively disposed along two closest rows are spatially staggered from one another, hereinafter "two closest ones" of the first plurality of thermoelectric conduction legs. As such, a space can be spared on the substrate between one and a respective next closest one of the first plurality of thermoelectric conduction legs.

The method 100 continues to operation 106 in which a second plurality of thermoelectric conduction legs are formed on the substrate. In some embodiments, the second plurality of thermoelectric conduction legs are each formed of a p-type silicon-germanium (SiGe) material. In some embodiments, the second plurality of thermoelectric conduction legs are aligned along a respective row. And two of the second plurality of thermoelectric conduction legs that are respectively disposed along two closest rows are spatially staggered from one another, hereinafter "two closest ones of the second plurality of thermoelectric conduction legs." As such, part of the second plurality of thermoelectric conduction legs may be each disposed in the space on the substrate that is spared by the first plurality of thermoelectric conduction legs (i.e., a respective one and its next closest one), as mentioned above.

The method 100 continues to operation 108 in which two intermediate thermoelectric conduction structures are formed on respective ends of each of the second plurality of thermoelectric conduction legs. In some embodiments, the intermediate thermoelectric conduction structures are each formed of an n-type polysilicon material.

The method 100 continues to operation 110 in which a plurality of contact structures are formed so as to couple the first and second pluralities of thermoelectric conduction legs by the respective intermediate thermoelectric conduction structures. In some embodiments, a first portion of the contact structures are each coupled between respective ones of the first and second pluralities of thermoelectric conduction legs that are disposed end-to-end along a respective row. And a second portion of the contact structures are each coupled between respective ones of the first and second pluralities of thermoelectric conduction legs that are disposed side-by-side along a respective column. As such, along each row, a sub thermocouple device can be provided. More specifically, according to some embodiments, such a sub thermocouple device is formed by the respective ones of the first and second pluralities of thermoelectric conduction legs that are coupled to each other end-to-end by a respective one of the first portion of the contact structures. Further, the sub thermocouple device formed along the respective rows can be coupled to each other side-by-side by a respective one of the second portion of the contact structures.

The method 100 continues to operation 112 in which a dielectric layer is formed on the substrate. In some embodiments, the dielectric layer overlays the first and second pluralities of thermoelectric conduction legs, the intermediate thermoelectric conduction structures, and the contact features. The method 100 continues to operation 114 in which a patterned mask layer is formed over the dielectric layer. In some embodiments, the patterned mask layer includes a plurality of patterns (e.g., openings) that are each aligned with a space between two respective adjacent sub thermocouple devices. The method 100 continues to operation 116 in which a plurality of trenches are formed on a top surface of the substrate. In some embodiments, the plurality of trenches are formed using the patterned mask layer as a mask to etch respective portions of the dielectric layer and the substrate. Accordingly, the plurality of trenches may be each disposed in one of the above-mentioned spaces (i.e., the space between two respective adjacent sub thermocouple devices).

In some embodiments, operations of the method 100 may be associated with perspective views of a thermocouple device 200 at various fabrication stages as shown in FIGS. 2A, 2B, 2C, 2D, 2E, 2F, 2G, 2H, and 2J, respectively. For purposes of clarity of illustration, FIG. 2I shows a top view of the thermocouple device 200 corresponding to FIG. 2H; and FIGS. 2K and 2L show a top view and a cross-sectional view of the thermocouple device 200 corresponding to FIG. 2J, respectively. FIGS. 2A through 2L are simplified for a better understanding of the concepts of the present disclosure. For example, although the figures illustrate the thermocouple device 200, it is understood the thermocouple device 200 may comprise any number of other device features (e.g., source and drain features, a gate dielectric of a MOSFET (metal-oxide-semiconductor field-effect-transistor), an isolation feature such as STI (shallow trench isolation), FOX (filed oxide), and/or deep trenches, a buried semiconductor layer, a collector feature of a BJT (bipolar junction transistor), etc.), which are not shown in FIGS. 2A through 2L, for purposes of clarity of illustration.

Corresponding to operation 102 of FIG. 1, FIG. 2A is a perspective view of the thermocouple device 200 including a substrate 202 at one of the various stages of fabrication, according to some embodiments. In some embodiments, the substrate 202 comprises a crystalline silicon substrate (e.g., wafer). Further, in some embodiments, the crystalline silicon substrate 202 may be p-type doped, for example, including dopants of gallium, boron, and/or aluminum. In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

As mentioned above, the thermocouple device 200 may comprise any number of other device features, according to some embodiments. Moreover, in some embodiments, the method 100 of FIG. 1 may be CMOS-compatible. In other words, the operations of the method 100 can be reproduced by CMOS technologies such as, for example, bipolar junction-transistor-complementary-metal-oxide-semiconductor (BiCMOS) technologies. As such, in operation 102, when the substrate 202 is provided, the substrate 202 may include at least one of the followings device features: source and drain features, a gate dielectric of a respective MOSFET, an isolation feature such as STI, FOX, and/or deep trenches, a buried semiconductor layer, a collector feature of a respective BJT, etc.

Figure 2B:
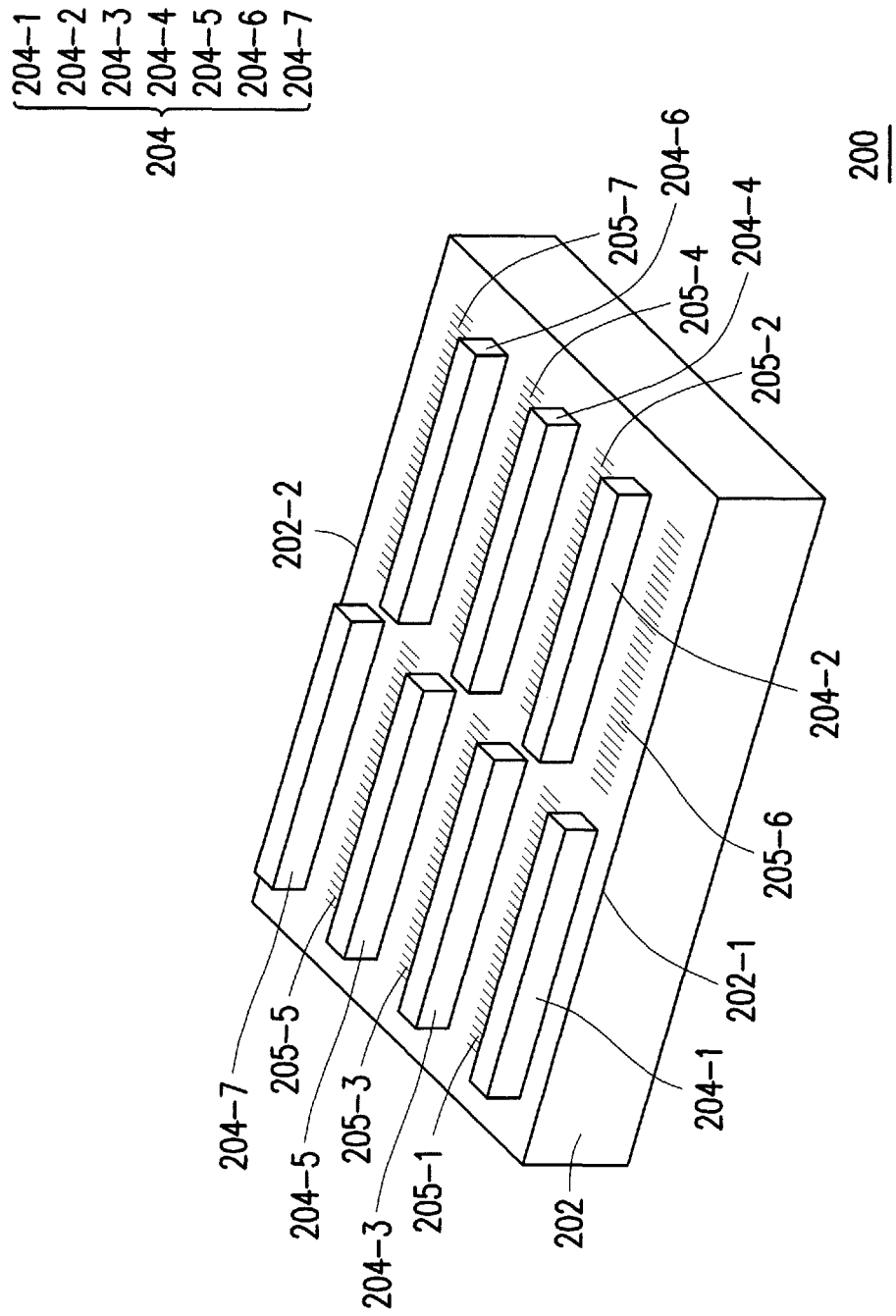

Corresponding to operation 104 of FIG. 1, FIG. 2B is a perspective view of the thermocouple device 200 including a first plurality of thermoelectric conduction legs 204, which are formed at one of the various stages of fabrication, according to some embodiments. As mentioned above, the first plurality of thermoelectric conduction legs 204 are each aligned along a respective row (e.g., the X direction), and any two closest ones of the first plurality of thermoelectric conduction legs 204 are spatially staggered from one another so as to spare a space on the substrate 202 between one and a next closest one of first plurality of thermoelectric conduction legs 204.

For example, as shown in the illustrated embodiment of FIG. 2B, the first plurality of thermoelectric conduction legs 204 include: 204-1, 204-2, 204-3, 204-4, 204-5, 204-6, and 204-7. Each of the thermoelectric conduction legs 204-1, 204-2, 204-3, 204-4, 204-5, 204-6, and 204-7 is disposed along a respective row. Moreover, the thermoelectric conduction leg 204-1 and the thermoelectric conduction leg 204-2 are spatially staggered from each other so as to spare a space 205-1 between the thermoelectric conduction legs 204-1 and its next closest one 204-3; the thermoelectric conduction leg 204-2 and the thermoelectric conduction legs 204-3 spatially staggered from each other so as to spare a space 205-2 between the thermoelectric conduction legs 204-2 and its next closest one 204-4; the thermoelectric conduction leg 204-3 and the thermoelectric conduction leg 204-4 are spatially staggered from each other so as to spare a space 205-3 between the thermoelectric conduction legs 204-3 and its next closest one 204-5; the thermoelectric conduction leg 204-4 and the thermoelectric conduction leg 204-5 are spatially staggered from each other so as to spare a space 205-4 between the thermoelectric conduction legs 204-4 and its next closest one 204-6; the thermoelectric conduction leg 204-5 and the thermoelectric conduction leg 204-6 are spatially staggered from each other so as to spare a space 205-5 between the thermoelectric conduction legs 204-5 and its next closest one 204-7.

It is noted that, after the formation of the first plurality of thermoelectric conduction legs 204 (e.g., 204-1 to 204-7), spaces 205-6 and 205-7 can also be defined. In some embodiments, the space 205-6 may be formed next to the thermoelectric conduction leg 204-1 (i.e., end-to-end and along a same row), and between a first edge 202-1 of the substrate 202 and the thermoelectric conduction leg 204-2; and the space 205-7 may be disposed next to the thermoelectric conduction leg 204-7 (i.e., end-to-end and along a same row), and between a second edge 202-2 of the substrate 202 and the thermoelectric conduction leg 204-6. In some embodiments, the spaces 205-1 to 205-7 may be used to dispose a second plurality of thermoelectric conduction legs therein, which will be discussed in further detail below.

In some embodiments, each of the first plurality of thermoelectric conduction legs 204 is formed of a polysilicon material. Moreover, in some embodiments, each of the first plurality of thermoelectric conduction legs 204 is formed of an n-type polysilicon material, for example, a polysilicon material doped with phosphorus, arsenic, antimony, or the like.

As mentioned above, each of the operations of the method 100 (FIG. 1) is BiCMOS compatible, in accordance with some embodiments. As such, in some embodiments, each of the first plurality of thermoelectric conduction legs 204, formed in the operation 104 of FIG. 1, may include a gate feature of a respective MOSFET. In some embodiments, such a "gate" thermoelectric conduction leg 204 may be formed using a suitable gate-forming process in BiCMOS technologies such as, for example, atomic layer deposition (ALD), chemical vapor deposition (CVD), physical vapor deposition (PVD), plating, or a combination thereof.

Figure 2C:
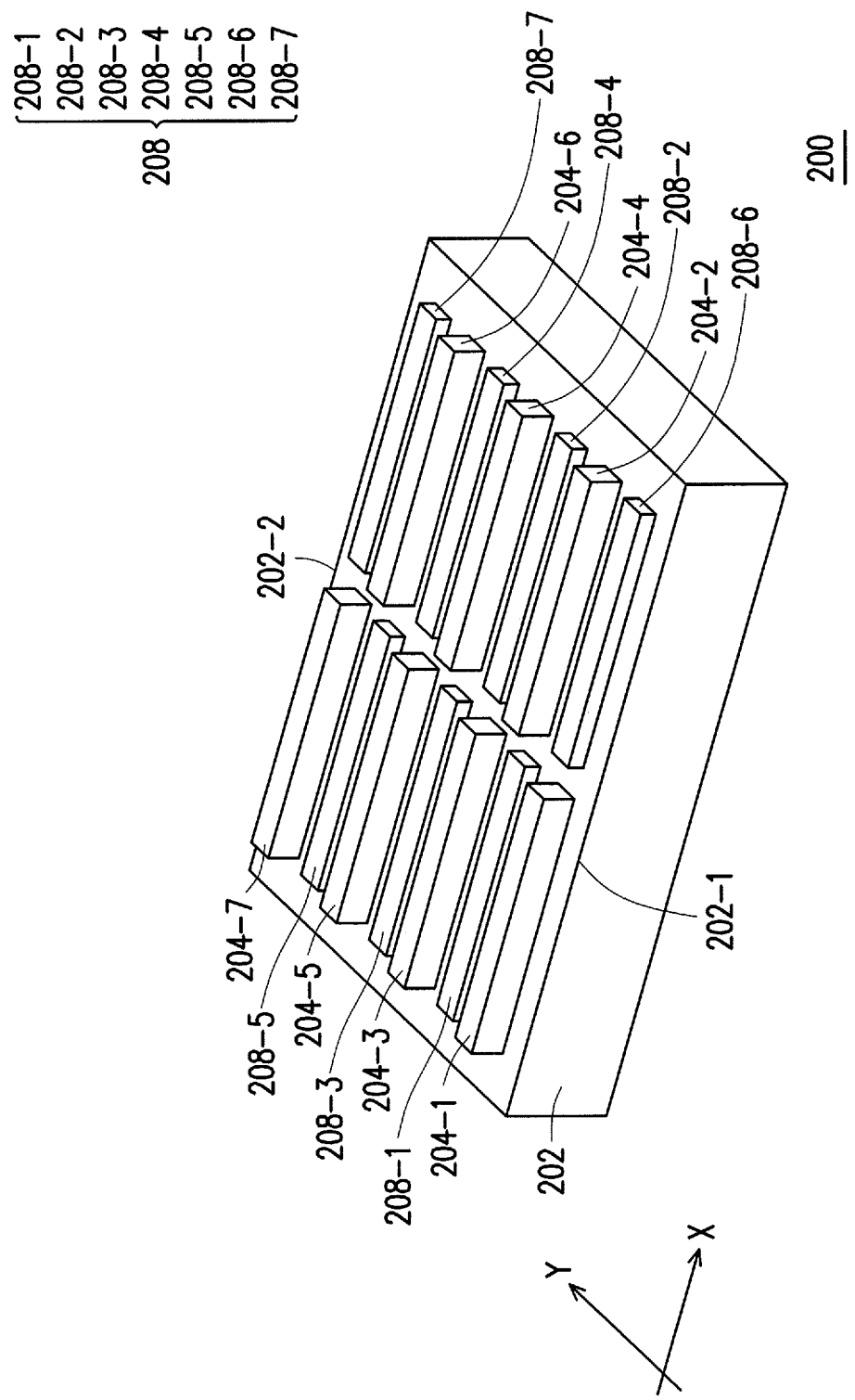

Corresponding to operation 106 of FIG. 1, FIG. 2C is a perspective view of the thermocouple device 200 including a second plurality of thermoelectric conduction legs 208, which are formed at one of the various stages of fabrication, according to some embodiments. As mentioned above, the second plurality of thermoelectric conduction legs 208 are each aligned a respective row (e.g., the X direction), and one of the second plurality of thermoelectric conduction legs 208 is spatially staggered from its respective two closest ones so that each of the thermoelectric conduction legs 208 can be disposed in a respective one of the spaces 205-1 to 205-7 (FIG. 2B).

For example, as shown in the illustrated embodiment of FIG. 2C, the second plurality of thermoelectric conduction legs 208 include: 208-1, 208-2, 208-3, 208-4, 208-5, 208-6, and 208-7. Each of the thermoelectric conduction legs 208-1, 208-2, 208-3, 208-4, 208-5, 208-6, and 208-7 is disposed along a respective row. Moreover, the thermoelectric conduction leg 208-1 is spatially staggered from the thermoelectric conduction legs 208-2 and 208-6, which are closest to leg 208-1, so that the thermoelectric conduction leg 208-1 can be disposed in the space 205-1 that is between the thermoelectric conduction legs 204-1 and 204-3 (FIG. 2B). Similarly, the thermoelectric conduction leg 208-2 is spatially staggered from the thermoelectric conduction legs 208-1 and 208-3 so that the thermoelectric conduction leg 208-2 can be disposed in the space 205-2 that is between the thermoelectric conduction legs 204-2 and 204-4 (FIG. 2B); the thermoelectric conduction leg 208-3 is spatially staggered from the thermoelectric conduction legs 208-2 and 208-4 so that the thermoelectric conduction leg 208-3 can be disposed in the space 205-3 that is between the thermoelectric conduction legs 204-3 and 204-5 (FIG. 2B); the thermoelectric conduction leg 208-4 is spatially staggered from the thermoelectric conduction legs 208-3 and 208-5 so that the thermoelectric conduction leg 208-4 can be disposed in the space 205-4 that is between the thermoelectric conduction legs 204-4 and 204-6 (FIG. 2B); the thermoelectric conduction leg 208-5 is spatially staggered from the thermoelectric conduction legs 208-4 and 208-7 so that the thermoelectric conduction leg 208-5 can be disposed in the space 205-5 that is between the thermoelectric conduction legs 204-5 and 204-7 (FIG. 2B).

It is noted that, in some embodiments, the thermoelectric conduction leg 208-6 is spatially staggered from the thermoelectric conduction leg 208-1 so that the thermoelectric conduction leg 208-6 can be disposed in the space 205-6 that is between the edge 202-1 and the thermoelectric conduction leg 204-2; and the thermoelectric conduction leg 208-7 is spatially staggered from the thermoelectric conduction leg 208-5 so that the thermoelectric conduction leg 208-7 can be disposed in the space 205-7 that is between the edge 202-2 and the thermoelectric conduction leg 204-6.

In some embodiments, each of the second plurality of thermoelectric conduction legs 208 is formed of a silicon-germanium material. Moreover, in some embodiments, each of the second plurality of thermoelectric conduction legs 208 is formed of a p-type silicon-germanium material, for example, a silicon-germanium material doped with boron, gallium, aluminum, or the like.

Similarly, as mentioned above, each of the operations of the method 100 (FIG. 1) is BiCMOS compatible, in accordance with some embodiments. As such, in some embodiments, each of the second plurality of thermoelectric conduction legs 208, formed in the operation 106 of FIG. 1, may include a base feature of a respective BJT. In some embodiments, such a "base" thermoelectric conduction leg 208 may be formed using a suitable base-forming process BiCMOS technologies such as, for example, ALD, CVD, PVD, plating, or a combination thereof.

Figure 2D:
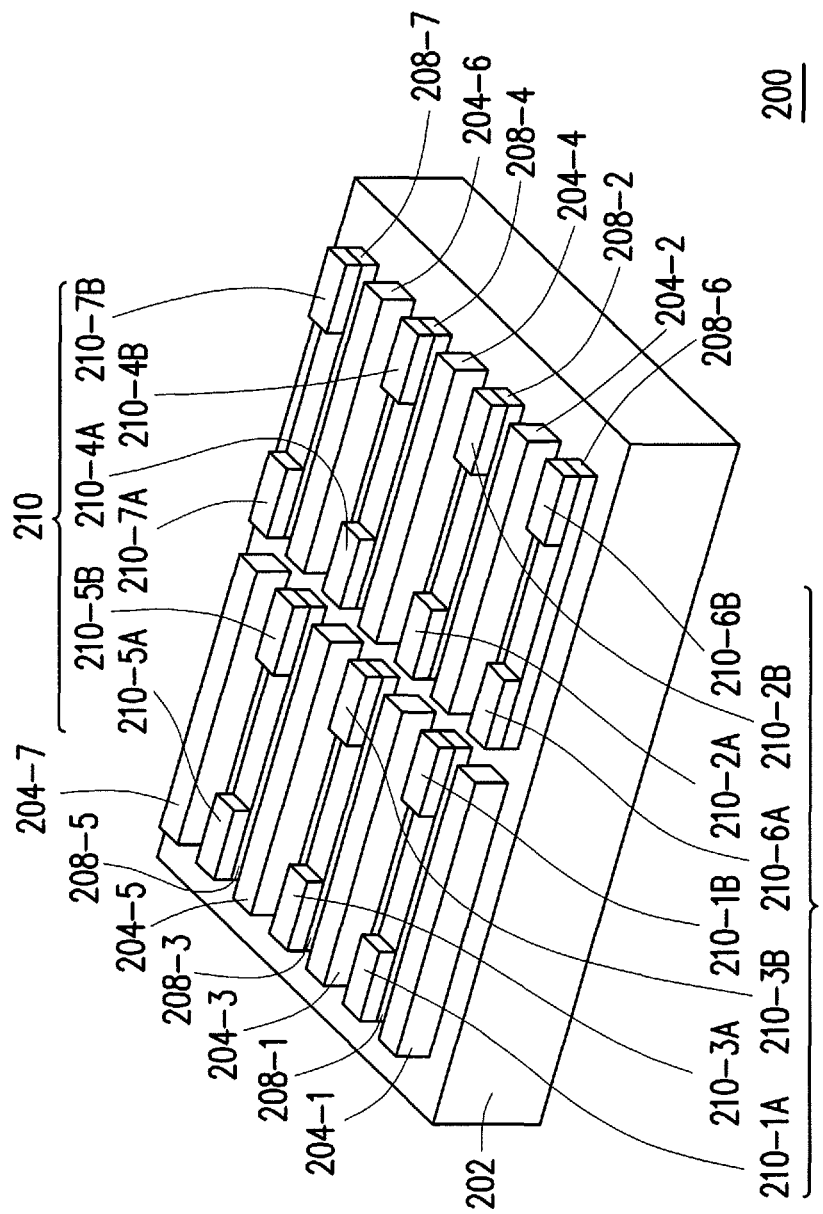

Corresponding to operation 108 of FIG. 1, FIG. 2D is a perspective view of the thermocouple device 200 including a plurality of intermediate thermoelectric conduction structures 210, which are formed at one of the various stages of fabrication, according to some embodiments. More specifically, each of the intermediate thermoelectric conduction structures 210 (e.g., 210-1A, 210-1B, 210-2A, 210-2B, 210-3A, 210-3B, 210-4A, 210-4B, 210-5A, 210-5B, 210-6A, 210-6B, 210-7A, and 210-7B) is disposed at a respective end of a corresponding one of the second plurality of thermoelectric conduction legs 208, which will be described in further detail below.

In some embodiments, the intermediate thermoelectric conduction structures 210-1A and 210-1B may be formed as a pair, and each of the pair is disposed at a respective end of the thermoelectric conduction leg 208-1; the intermediate thermoelectric conduction structures 210-2A and 210-2B may be formed as a pair, and each of the pair is disposed at a respective end of the thermoelectric conduction leg 208-2; the intermediate thermoelectric conduction structures 210-3A and 210-3B may be formed as a pair, and each of the pair is disposed at a respective end of the thermoelectric conduction leg 208-3; the intermediate thermoelectric conduction structures 210-4A and 210-4B may be formed as a pair, and each of the pair is disposed at a respective end of the thermoelectric conduction leg 208-4; the intermediate thermoelectric conduction structures 210-5A and 210-5B may be formed as a pair, and each of the pair is disposed at a respective end of the thermoelectric conduction leg 208-5; the intermediate thermoelectric conduction structures 210-6A and 210-6B may be formed as a pair, and each of the pair is disposed at a respective end of the thermoelectric conduction leg 208-6; the intermediate thermoelectric conduction structures 210-7A and 210-7B may be formed as a pair, and each of the pair is disposed at a respective end of the thermoelectric conduction leg 208-7.

In some embodiments, each of the plurality of intermediate thermoelectric conduction structures 210 is formed of a polysilicon material. Moreover, in some embodiments, each of the plurality of intermediate thermoelectric conduction structures 210 is formed of an n-type polysilicon material, for example, a polysilicon material doped with phosphorus, arsenic, antimony, or the like.

Similarly, as mentioned above, each of the operations of the method 100 (FIG. 1) is BiCMOS compatible, in accordance with some embodiments. As such, in some embodiments, each of the plurality of thermoelectric conduction structures 210, formed in the operation 108 of FIG. 1, may include an emitter feature of a respective BJT. In some embodiments, such an "emitter" thermoelectric conduction structure 210 may be formed using a suitable base-forming process BiCMOS technologies such as, for example, ALD, CVD, PVD, plating, or a combination thereof.

Figure 2E:
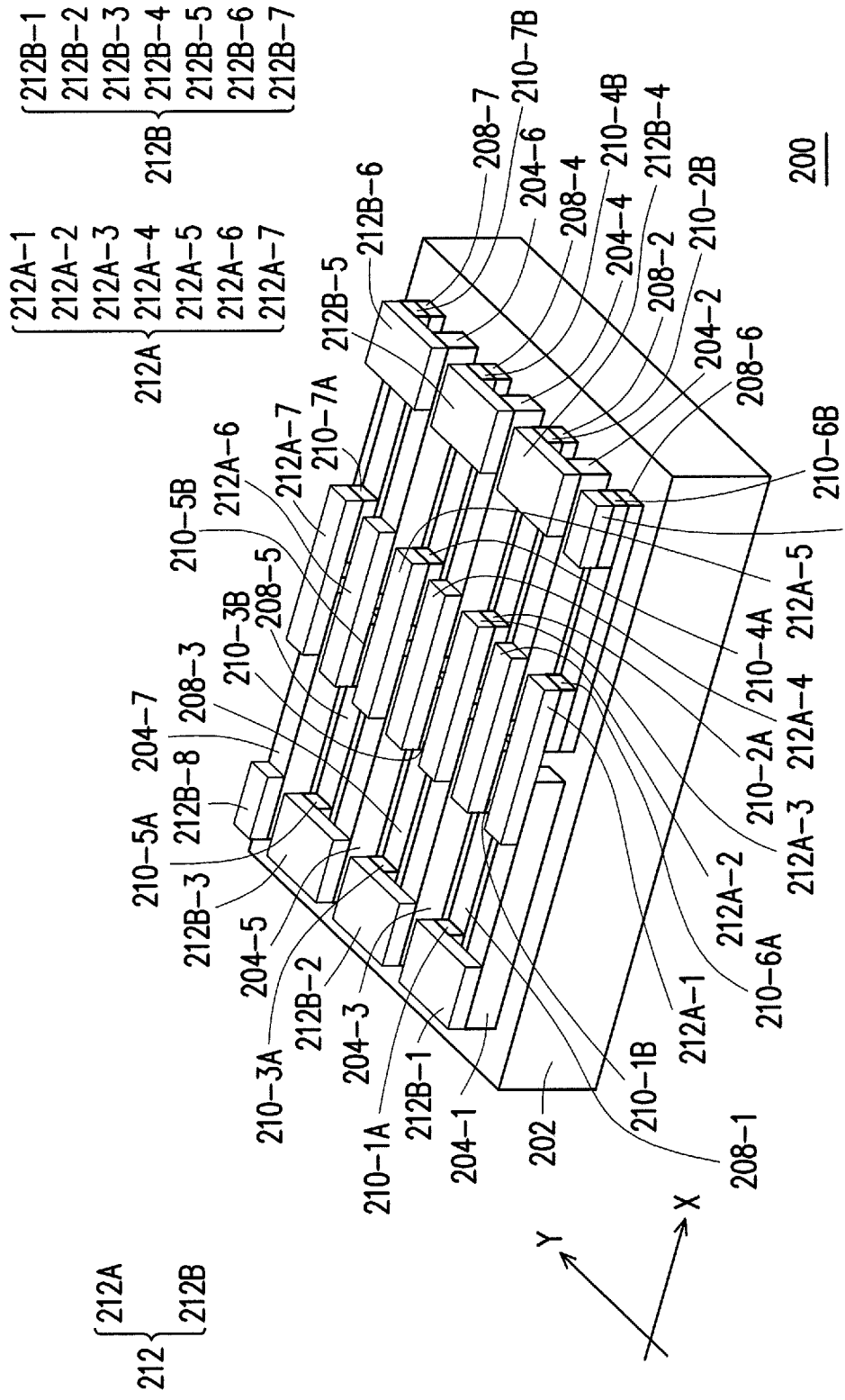

Corresponding to operation 110 of FIG. 1, FIG. 2E is a perspective view of the thermocouple device 200 including a plurality of contact structures 212, which are at one of the various stages of fabrication, according to some embodiments. In some embodiments, the contact structure 212 may be formed of a conductive material such as, for example, copper, silver, gold, tungsten, or a combination thereof.

In some embodiments, the plurality of contact structures 212 may include two portions 212A and 212B. More specifically, the first portion 212A (e.g., 212A-1, 212A-2, 212A-3, 212A-4, 212A-5, 212A-6, and 212A-7) of the contact structures 212 are each coupled between respective ones of the first and second pluralities of thermoelectric conduction legs (204 and 208) that are disposed end-to-end along the respective row (the X direction); and part of the second portion 212B (e.g., 212B-1, 212B-2, 212B-3, 212B-4, 212B-5, and 212B-6) of the contact structures 212 are each coupled between respective ones of the first and second pluralities of thermoelectric conduction legs (204 and 208) that are disposed side-by-side along a respective column (the Y direction), which will be discussed in further detail below. It is noted that, in some embodiments, contact structure 212B-7 of the second portion 212B is disposed on the intermediate thermoelectric conduction structure 210-6B, which is at an end of the thermoelectric conduction leg 208-6; and contact structure 212B-8 of the second portion 212B is disposed at an end of the thermoelectric conduction leg 204-7 (i.e., the contact structures 212B-7 and 212B-8 is coupled only to a respective thermoelectric conduction leg).

Referring first to the first portion 212A of the contact structures in FIG. 2E, in some embodiments, the contact structure 212A-1 is formed to couple the end-to-end thermoelectric conduction legs 208-6 and 204-1 through the intermediate thermoelectric conduction structure 210-6A and directly, respectively; the contact structure 212A-2 is formed to couple the end-to-end thermoelectric conduction legs 208-1 and 204-2 through the intermediate thermoelectric conduction structure 210-1B and directly, respectively; the contact structure 212A-3 is formed to couple the end-to-end thermoelectric conduction legs 208-2 and 204-3 through the intermediate thermoelectric conduction structure 210-2A and directly, respectively; the contact structure 212A-4 is formed to couple the end-to-end thermoelectric conduction legs 208-3 and 204-4 through the intermediate thermoelectric conduction structure 210-3B and directly, respectively; the contact structure 212A-5 is formed to couple the end-to-end thermoelectric conduction legs 208-4 and 204-5 through the intermediate thermoelectric conduction structure 210-4A and directly, respectively; the contact structure 212A-6 is formed to couple the end-to-end thermoelectric conduction legs 208-5 and 204-6 through the intermediate thermoelectric conduction structure 210-5B and directly, respectively; the contact structure 212A-7 is formed to couple the end-to-end thermoelectric conduction legs 208-7 and 204-7 through the intermediate thermoelectric conduction structure 210-7A and directly, respectively.

Referring then to the second portion 212B of the contact structures in FIG. 2E, in some embodiments, the contact structure 212B-1 is formed to couple the side-by-side thermoelectric conduction legs 204-1 and 208-1 directly and through the intermediate thermoelectric conduction structure 210-1A, respectively; the contact structure 212B-2 is formed to couple the side-by-side thermoelectric conduction legs 204-3 and 208-3 directly and through the intermediate thermoelectric conduction structure 210-3A, respectively; the contact structure 212B-3 is formed to couple the side-by-side thermoelectric conduction legs 204-5 and 208-5 directly and through the intermediate thermoelectric conduction structure 210-5A, respectively; the contact structure 212B-4 is formed to couple the side-by-side thermoelectric conduction legs 204-2 and 208-2 directly and through the intermediate thermoelectric conduction structure 210-2B, respectively; the contact structure 212B-5 is formed to couple the side-by-side thermoelectric conduction legs 204-4 and 208-4 directly and through the intermediate thermoelectric conduction structure 210-4B, respectively; the contact structure 212B-6 is formed to couple the side-by-side thermoelectric conduction legs 204-6 and 208-7 directly and through the intermediate thermoelectric conduction structure 210-7B, respectively.

Figure 2F:
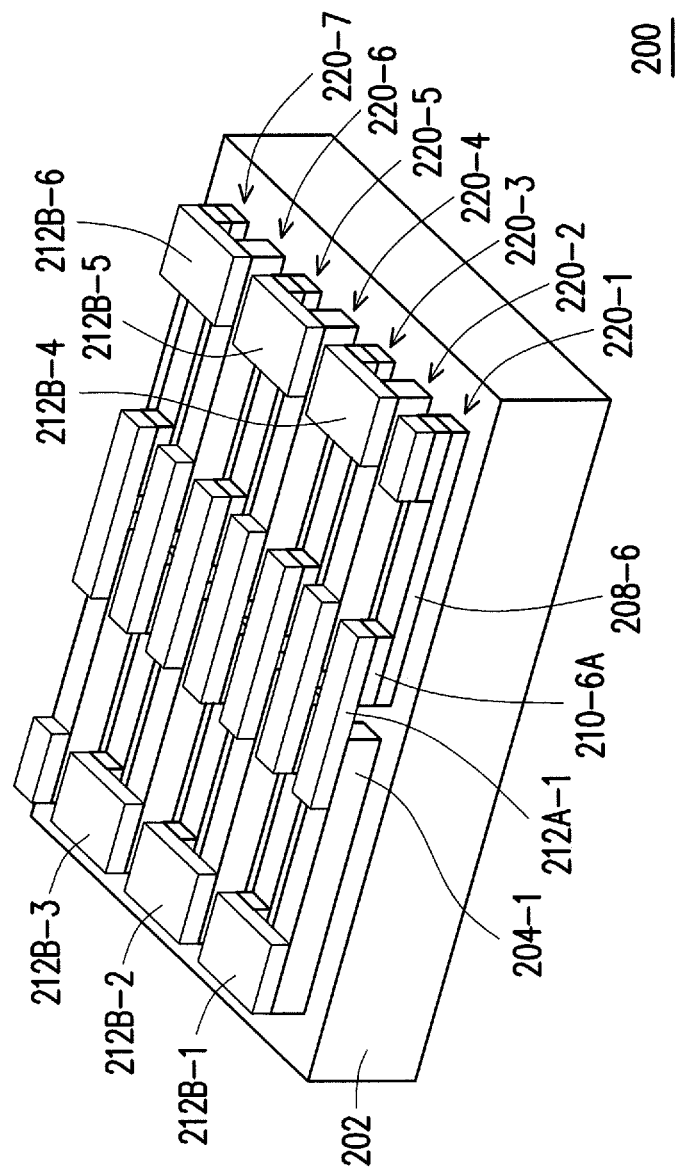

As such, plural sub thermocouple devices 220-1, 220-2, 220-3, 220-4, 220-5, 220-6 and 220-7 can be formed on the substrate 202, which is shown in FIG. 2F. It is noted that FIG. 2F is reproduced from FIG. 2E, and for purposes of clarity of illustration, some numeric references in FIG. 2E are not repeated in FIG. 2F. Taking the sub thermocouple device 220-1 as a representative example, in some embodiments, each of the sub thermocouple devices is constituted of the respective ones of the first and second pluralities of thermoelectric conduction legs (e.g., 204-1 and 208-6) that are coupled to each other end-to-end by a respective one of the first portion (e.g., 212A-1) of the contact structures 212 and a respective one of the intermediate thermoelectric conduction structure (e.g., 201-6A).

Further, the sub thermocouple devices 220-1 to 220-7 formed along the respective rows can be coupled to each other by a respective one of the second portion 212B of the contact structures 212, in accordance with some embodiments. As such, the sub thermocouple devices 220-1 to 220-7 may be "electrically" coupled in series when a current/voltage signal is generated from each sub thermocouple device, which will be discussed in further detail below.

For example, the sub thermocouple device 220-1 is coupled to the sub thermocouple device 220-2 by the contact structure 212B-1; the sub thermocouple device 220-2 is further coupled to the sub thermocouple device 220-3 by the contact structure 212B-4; the sub thermocouple device 220-2 is further coupled to the sub thermocouple device 220-3 by the contact structure 212B-4; the sub thermocouple device 220-3 is further coupled to the sub thermocouple device 220-4 by the contact structure 212B-2; the sub thermocouple device 220-4 is further coupled to the sub thermocouple device 220-5 by the contact structure 212B-5; the sub thermocouple device 220-5 is further coupled to the sub thermocouple device 220-6 by the contact structure 212B-3; and the sub thermocouple device 220-6 is further coupled to the sub thermocouple device 220-7 by the contact structure 212B-6. Thereafter, according to some embodiments, the sub thermocouple devices 220-1 to 220-7 may be "electrically" coupled in series.

Figure 2G:
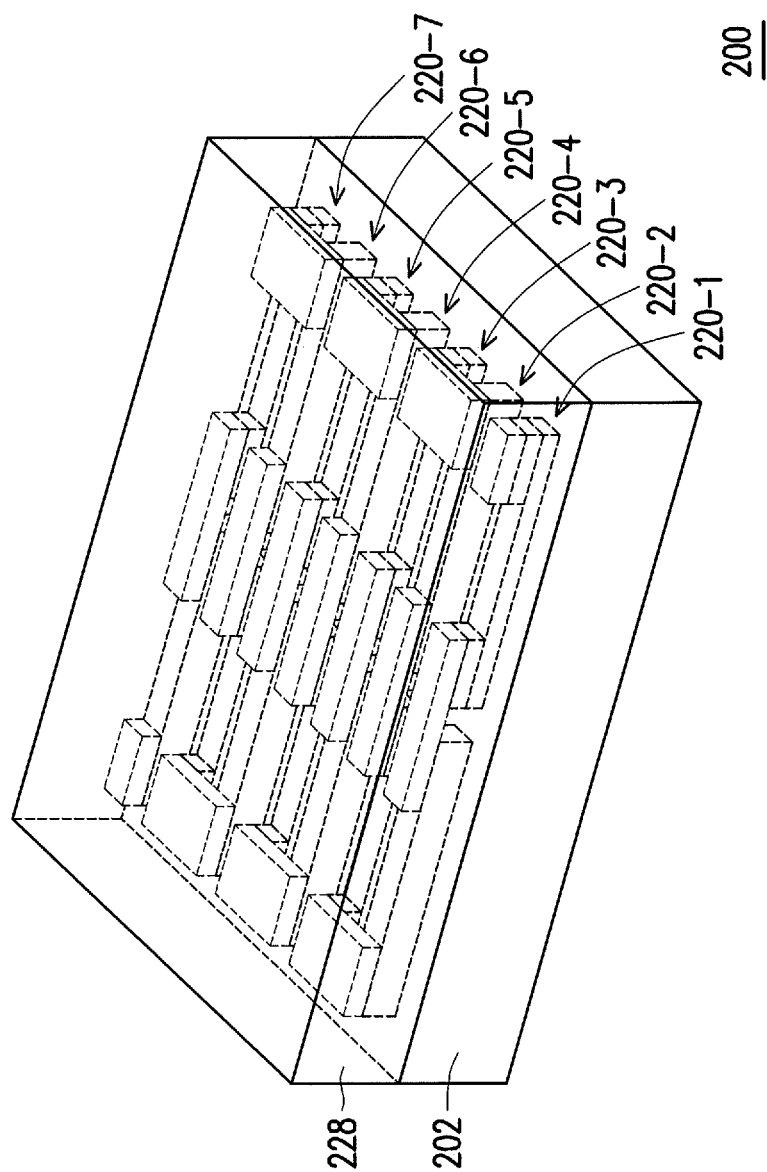

Corresponding to operation 112 of FIG. 1, FIG. 2G is a perspective view of the thermocouple device 200 including a dielectric layer 228 overlaying the sub thermocouple devices 220-1 to 220-7, which is formed at one of the various stages of fabrication, according to some embodiments. The dielectric layer 228 may include one or more dielectric materials such as silicon nitride (SiN), silicon oxide (SiO), silicon carbide (SiC), silicon oxycarbide (SiOC), silicon oxycarbon nitride (SiOCN), and/or a combination thereof. The dielectric layer 228 may include a single layer or a multi-layer structure. The dielectric layer 228 may be formed by chemical oxidation, thermal oxidation, ALD, CVD, and/or other suitable methods.

Figure 2H:
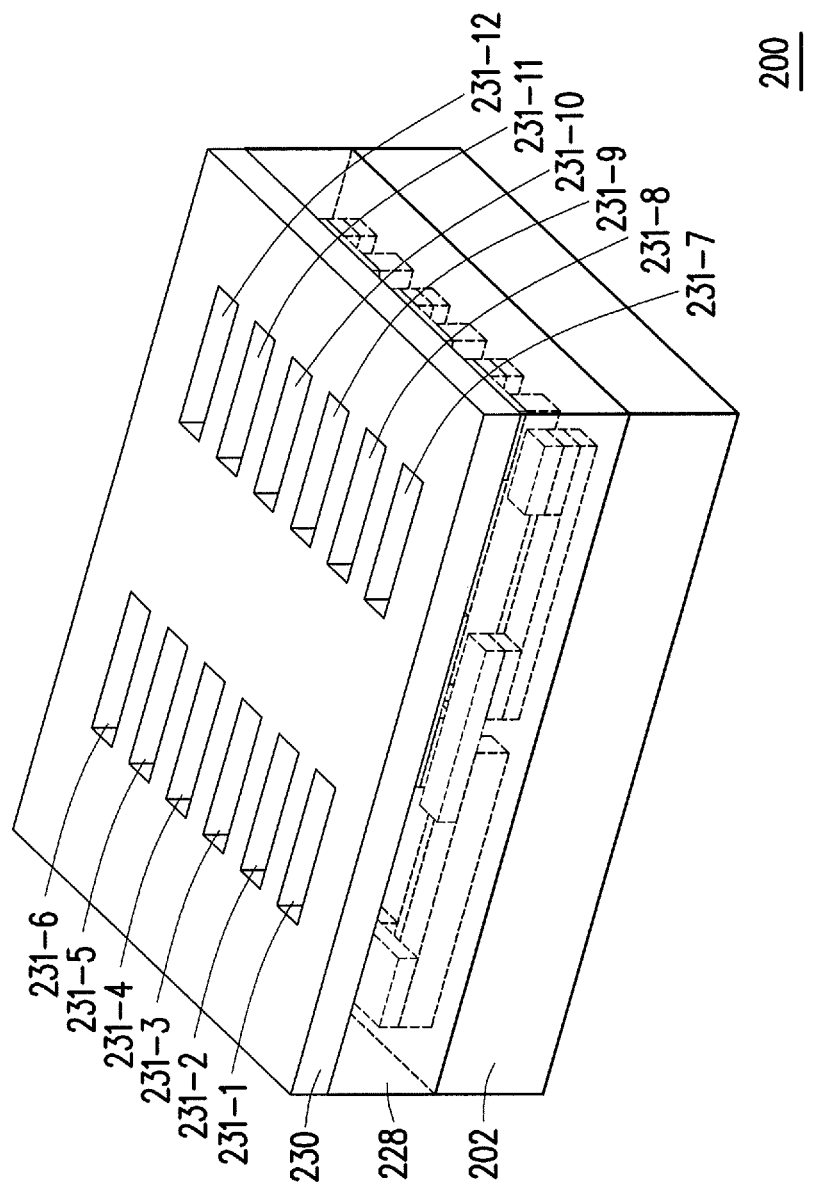
Figure 2I:
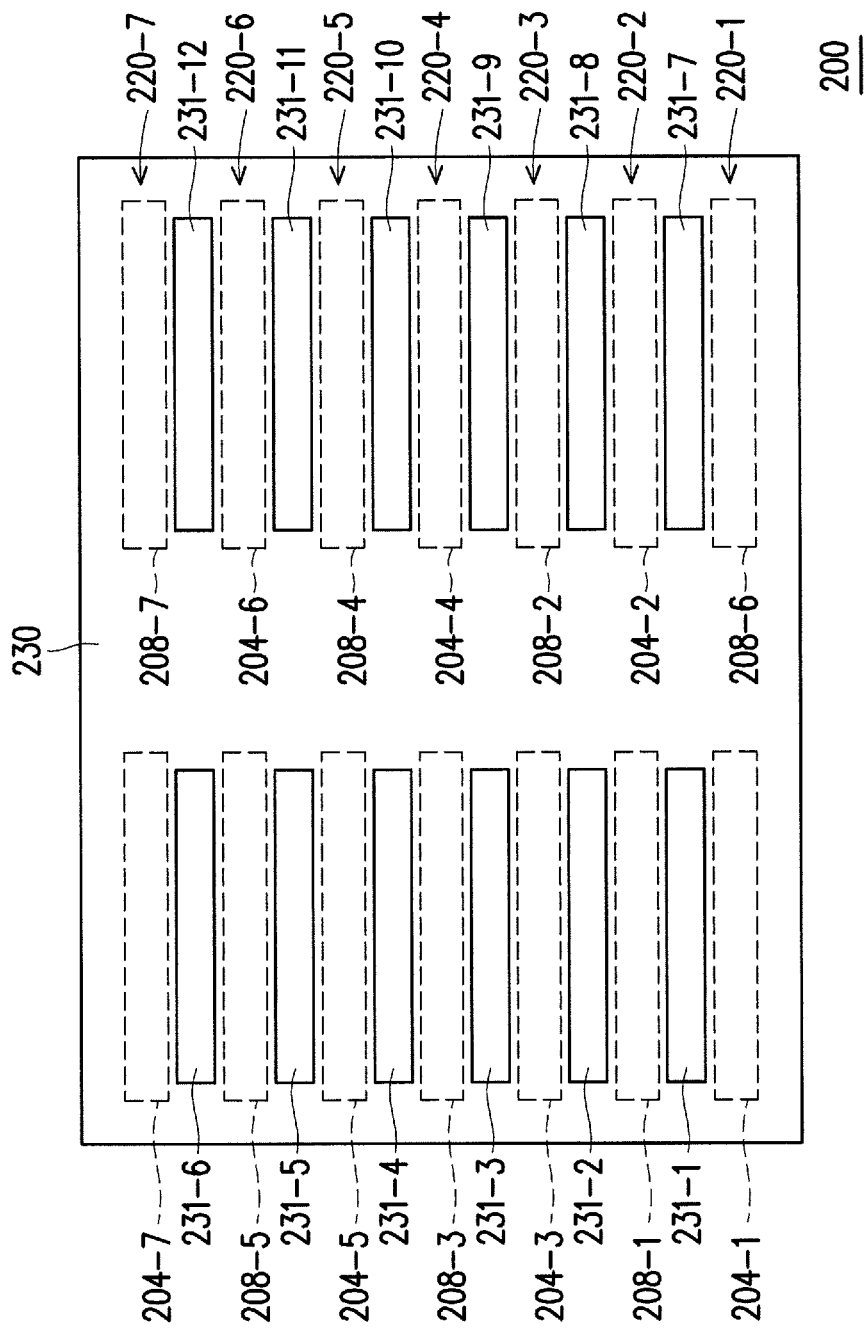
FIGS. 2I and 2K illustrate corresponding top views of FIGS. 2H and 2J, respectively, in accordance with some embodiments.

Corresponding to operation 114 of FIG. 1, FIG. 2H is a perspective view of the thermocouple device 200 including a patterned mask layer 230 overlaying the dielectric layer 228, which is formed at one of the various stages of fabrication, according to some embodiments, and FIG. 2I is a corresponding top view of FIG. 2H. In some embodiments, the patterned mask layer 230 may be formed of a photoresist material, a hard mask material (e.g., SiN), or the like.

In some embodiments, the patterned mask layer 230 includes one or more openings 231-1, 231-2, 231-3, 231-4, 231-5, 231-6, 231-7, 231-8, 231-9, 231-10, 231-11, and 231-12. Each of the openings (231-1 to 231-12) is aligned to a location on the substrate 202 located between respective thermoelectric conduction legs that belong to two adjacent sub thermocouple devices (e.g., 220-1 to 220-7), respectively, which is shown in the illustrated embodiment of FIG. 2I.

More specifically, the opening 231-1 is aligned to the location disposed between the thermoelectric conduction legs 204-1 and 208-1 that belong to the adjacent sub thermocouple devices 220-1 and 220-2, respectively; the opening 231-2 is aligned to the location disposed between the thermoelectric conduction legs 204-3 and 208-1 that belong to the adjacent sub thermocouple devices 220-3 and 220-2, respectively; the opening 231-3 is aligned to the location disposed between the thermoelectric conduction legs 208-3 and 204-3 that belong to the adjacent sub thermocouple devices 220-4 and 220-3, respectively; the opening 231-4 is aligned to the location disposed between the thermoelectric conduction legs 204-5 and 208-3 that belong to the adjacent sub thermocouple devices 220-5 and 220-4, respectively; the opening 231-5 is aligned to the location disposed between the thermoelectric conduction legs 208-5 and 204-5 that belong to the adjacent sub thermocouple devices 220-6 and 220-5, respectively; the opening 231-6 is aligned to the location disposed between the thermoelectric conduction legs 204-7 and 208-5 that belong to the adjacent sub thermocouple devices 220-7 and 220-6, respectively; the opening 231-7 is aligned to the location disposed between the thermoelectric conduction legs 204-2 and 208-6 that belong to the adjacent sub thermocouple devices 220-2 and 220-1, respectively; the opening 231-8 is aligned to the location disposed between the thermoelectric conduction legs 204-2 and 208-2 that belong to the adjacent sub thermocouple devices 220-2 and 220-3, respectively; the opening 231-9 is aligned to the location disposed between the thermoelectric conduction legs 204-4 and 208-2 that belong to the adjacent sub thermocouple devices 220-4 and 220-3, respectively; the opening 231-10 is aligned to the location disposed between the thermoelectric conduction legs 208-4 and 204-4 that belong to the adjacent sub thermocouple devices 220-5 and 220-4, respectively; the opening 231-11 is aligned to the location disposed between the thermoelectric conduction legs 204-6 and 208-4 that belong to the adjacent sub thermocouple devices 220-6 and 220-5, respectively; and the opening 231-12 is aligned to the location disposed between the thermoelectric conduction legs 208-7 and 204-6 that belong to the adjacent sub thermocouple devices 220-7 and 220-6, respectively.

Figure 2J:
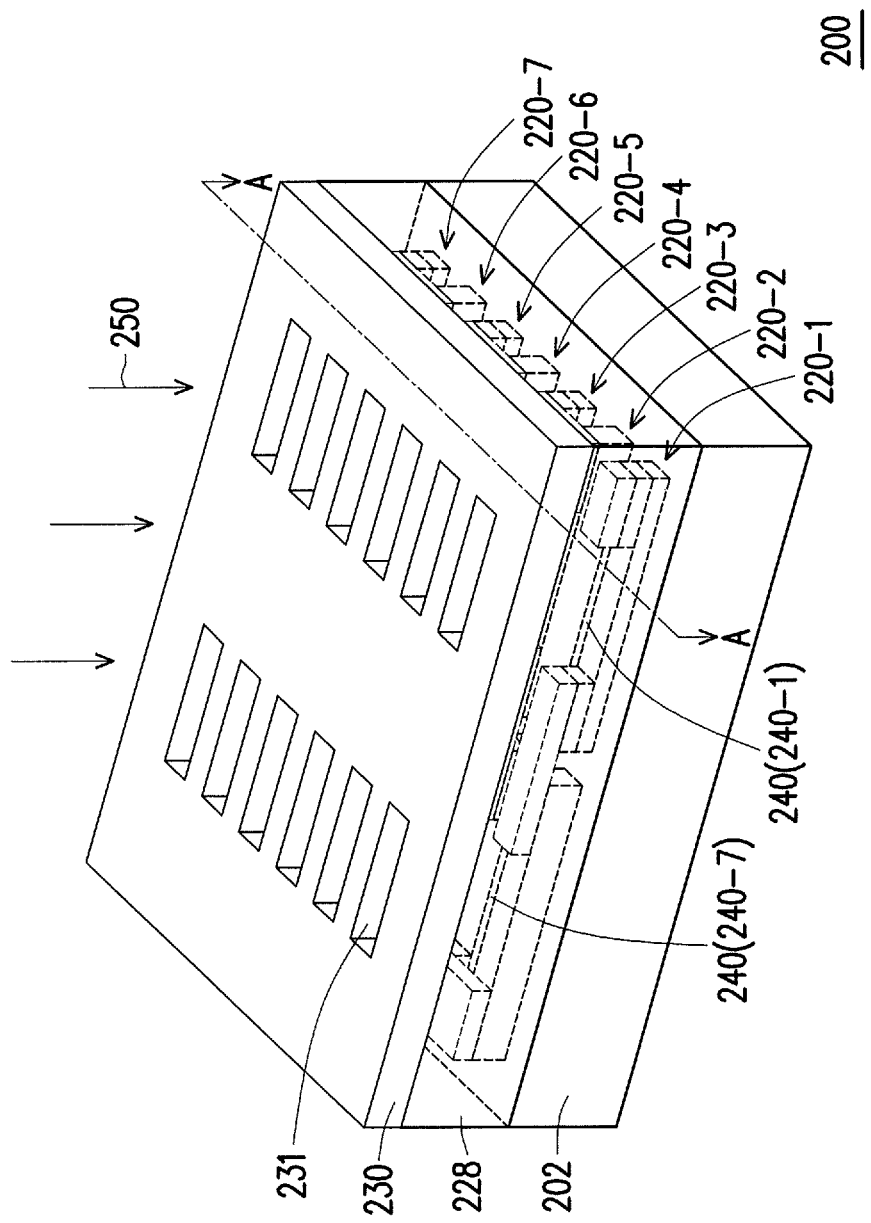
Figure 2K:
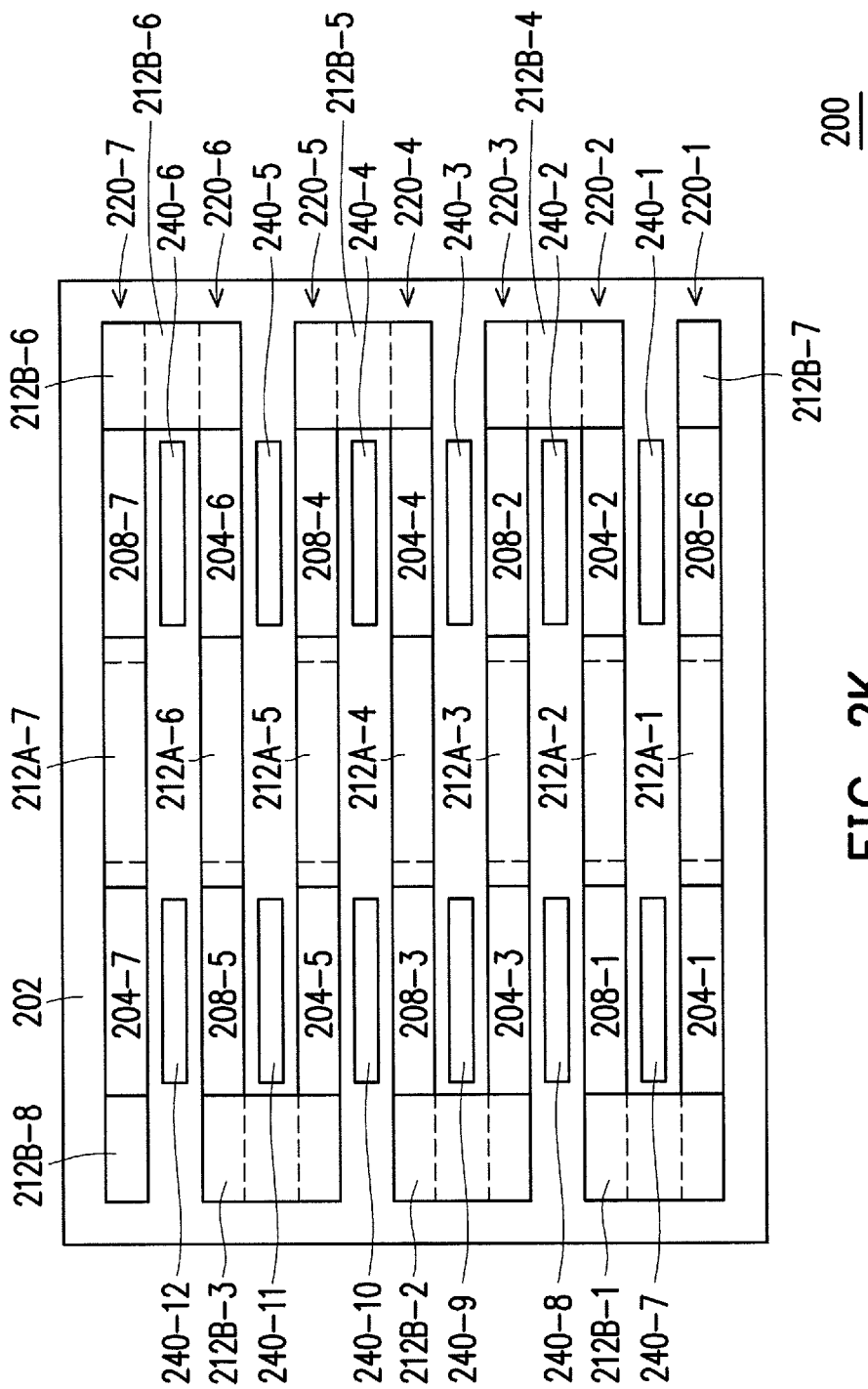
Figure 2L:
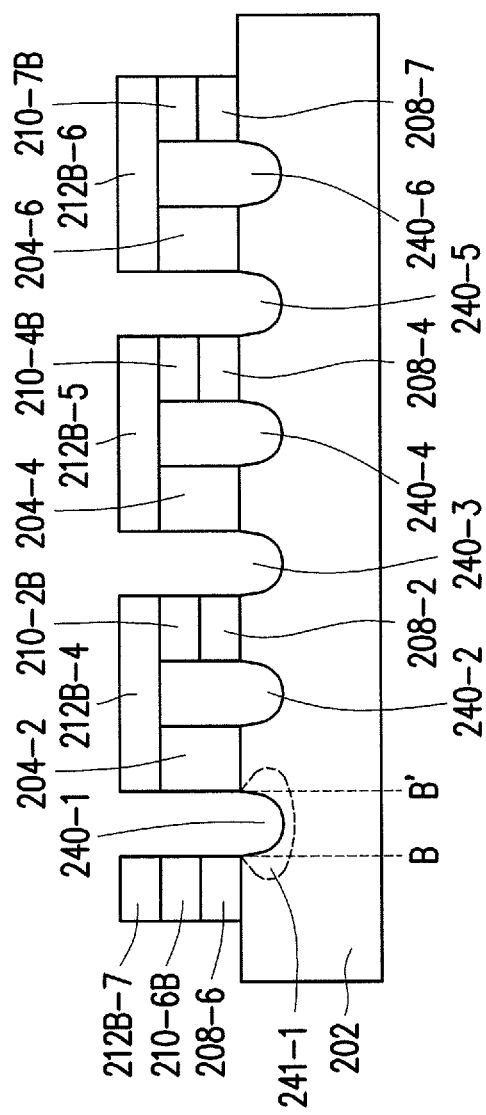
FIG. 2L illustrates a corresponding cross-sectional view of FIG. 2J, in accordance with some embodiments.

Corresponding to operation 116 of FIG. 1, FIG. 2J is a perspective view of the thermocouple device 200 including one or more trenches 240 between adjacent sub thermocouple devices (e.g., 220-1 to 220-7), which are formed at one of the various stages of fabrication, according to some embodiments, FIG. 2K is a corresponding top view of the thermocouple device 200, and FIG. 2L is a corresponding cross-sectional view, taken along line A-A, of the thermocouple device 200. In some embodiments, the trenches 240 are formed by performing at least one dry or wet etching process 250 on the dielectric layer 228 and the substrate 202 while using the patterned mask layer 230 as a mask. In some embodiments, the etching process 250 may include two sub processes that are performed to etch through the dielectric layer 228 and recess a top portion of the substrate 202, respectively, which will be illustrated and discussed in FIGS. 4A and 4B. As will be discussed below, the locations of the trenches 240 on a top surface of the substrate 202 may correspond to the openings (231-1 to 231-12 in FIG. 2H), which are collectively referred to as opening 231.

In some embodiments, the trenches 240 include: trenches 240-1, 240-2, 240-3, 240-4, 240-5, 240-6, 240-7, 240-8, 240-9, 240-10, 240-11, and 240-12 as shown in FIG. 2K, wherein each of the trenches is located between respective thermoelectric conduction legs (e.g., 204-1 to 204-7, and 208-1 to 208-7) of the two closest sub thermocouple devices (e.g., 220-1 to 220-7), which will be discussed in further detail below with respect to FIG. 2K. More specifically, each of the trenches (240-1 to 240-12) is substantially adjacent to respective side edges of the thermoelectric conduction legs (e.g., 204-1 to 204-7, and 208-1 to 208-7) of the two closest sub thermocouple devices (e.g., 220-1 to 220-7).

In the illustrated embodiment of FIG. 2K, the trench 240-1 is located between the thermoelectric conduction legs 208-6 and 204-2 that belong to the sub thermocouple devices 220-1 and 220-2, respectively; the trench 240-2 is located between the thermoelectric conduction legs 204-2 and 208-2 that belong to the sub thermocouple devices 220-2 and 220-3, respectively; the trench 240-3 is located between the thermoelectric conduction legs 208-2 and 204-4 that belong to the sub thermocouple devices 220-3 and 220-4, respectively; the trench 240-4 is located between the thermoelectric conduction legs 204-4 and 208-4 that belong to the sub thermocouple devices 220-4 and 220-5, respectively; the trench 240-5 is located between the thermoelectric conduction legs 208-4 and 204-6 that belong to the sub thermocouple devices 220-5 and 220-6, respectively; the trench 240-6 is located between the thermoelectric conduction legs 204-6 and 208-7 that belong to the sub thermocouple devices 220-6 and 220-7, respectively; the trench 240-7 is located between the thermoelectric conduction legs 204-1 and 208-1 that belong to the sub thermocouple devices 220-1 and 220-2, respectively; the trench 240-8 is located between the thermoelectric conduction legs 208-1 and 204-3 that belong to the sub thermocouple devices 220-2 and 220-3, respectively; the trench 240-9 is located between the thermoelectric conduction legs 204-3 and 208-3 that belong to the sub thermocouple devices 220-3 and 220-4, respectively; the trench 240-10 is located between the thermoelectric conduction legs 208-3 and 204-5 that belong to the sub thermocouple devices 220-4 and 220-5, respectively; the trench 240-11 is located between the thermoelectric conduction legs 204-5 and 208-5 that belong to the sub thermocouple devices 220-5 and 220-6, respectively; the trench 240-12 is located between the thermoelectric conduction legs 208-5 and 204-7 that belong to the sub thermocouple devices 220-6 and 220-7, respectively.

Referring to the illustrated embodiment of FIG. 2L, respective recessed profiles of the trenches 240-1 to 240-6 are shown (after the removal of the patterned mask layer 230 and the dielectric layer 228). In some embodiments, each of the trenches 240 may have a depth about 10 micrometer ($\mu$m). In some other embodiments, the second sub process of the etching process 250 may "over recess" the substrate 202. As such, each of the trenches 240 may have a respective recessed profile (e.g., 241-1) that outwardly extends beyond vertical projections (e.g., lines B and B') of respective thermoelectric conduction legs (e.g., 208-6 and 204-2).

Figure 3:
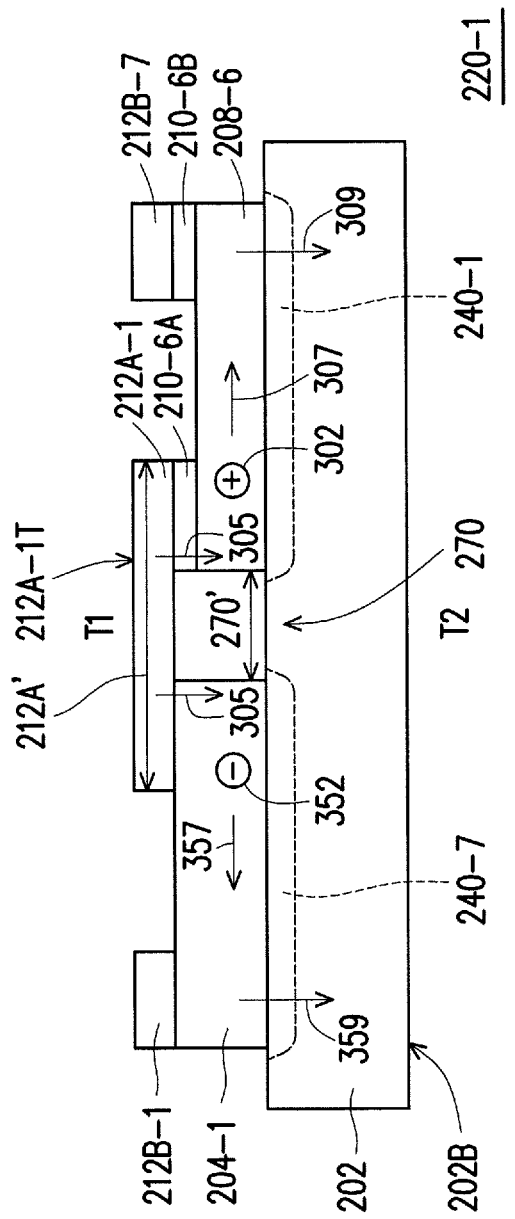
FIG. 3 illustrates a cross-sectional view of a sub thermocouple device of the thermocouple device, made by the method of FIG. 1, in accordance with some embodiments.

FIG. 3 illustrates a cross-sectional view of the sub thermocouple device 220-1, in accordance with some embodiments. It is noted that operations of the sub thermocouple device (220-1 to 220-7) of the thermocouple device 200 are substantially similar to each other. Thus, the sub thermocouple device 220-1 is reproduced in FIG. 3 as a representative example to illustrate the operation of each of the sub thermocouple device (220-1 to 220-7).

In some embodiments, the thermocouple device 200 may be placed in an environment having a temperature gradient to generate electric power, as mentioned above. More specifically, the thermocouple device 200 may be coupled to a first temperature $T_1$ at a first interface and to a second temperature $T_2$ at a second interface, wherein $T_1$ is substantially higher than $T_2$. Using the sub thermocouple device 220-1 as an example, the sub thermocouple device 220-1 is coupled to the temperature $T_1$ at the contact structure 212A-1's top surface 212A-1T, and to the temperature $T_2$ at the substrate 202's bottom surface 202B.

Due to a temperature gradient between $T_1$ and $T_2$, a first thermal flow may follow symbolic directions 305 traveling from the contact structure 212A-1 and through the intermediate thermoelectric conduction structure 210-6A, then 307 traveling along the thermoelectric conduction leg 208-6, and 309 traveling through the substrate 202 and to the bottom surface 202B; and a second thermal flow may follow symbolic directions 355 traveling from the contact structure 212A-1, then 357 traveling along the thermoelectric conduction leg 204-1, and 359 traveling through the substrate 202 and to the bottom surface 202B.

Moreover, a plurality of hot holes (e.g., 302) may be induced in the p-type doped thermoelectric conduction leg 208-6, and a plurality of hot electrons (e.g., 352) may be induced in the n-type doped thermoelectric conduction leg 204-1. As such, electric power (e.g., a voltage/current signal) can be collected from the contact structures 212B-7 and 212B-1. As mentioned above, the contact structure 212B-1 is configured to electrically couple the sub thermocouple device 220-1 to the sub thermocouple device 220-2 (FIG. 2F), and since the sub thermocouple device 220-2 may generate a respective voltage/current signal, the voltage/current signals, respectively generated by the sub thermocouple devices 220-1 and 220-2, may be electrically coupled in series (e.g., superimposed). Analogously, each of the rest sub thermocouple devices (202-3 to 202-7) is coupled to a respective sub thermocouple device in similar fashion as the sub thermocouple devices 220-1 and 220-2. Thereafter, in some embodiments, the thermocouple device 200 can electrically superimpose plural voltage/current signals that are generated by the sub thermocouple devices (220-1 to 220-7).

The trenches 240 (e.g., 240-1 and 240-7 shown in FIG. 3), formed between adjacent sub thermocouple devices, can further provide thermal insulation for each of the sub thermocouple devices (220-1 to 220-7), in accordance with some embodiments. More specifically, by forming the trenches 240, each of the sub thermocouple devices (220-1 to 220-7) may be effectively provided with a substantially larger temperature gradient (e.g., larger than $T_1$-$T_2$), which advantageously increase a respective level of the generated voltage/current signal.

Further, in some embodiments, after the formation of the trenches 240, a portion of the substrate 202 that is located between respective thermoelectric conduction legs (204 and 208) of each sub thermocouple device (220-1 to 220-7) may remain intact. Such a portion of the substrate 202, e.g., 270 in FIG. 3, may serve as a support structure for the sub thermocouple devices (220-1 to 220-7). In some embodiments, when the trench 240 has a depth of about 10 $\mu$m and the first portion of the contact structure 212A has a length 212A' of about 12 $\mu$m to about 15 $\mu$m, the support structure 270 may have a width 270' of about 2 $\mu$m to 4 $\mu$m.

Figure 4A:
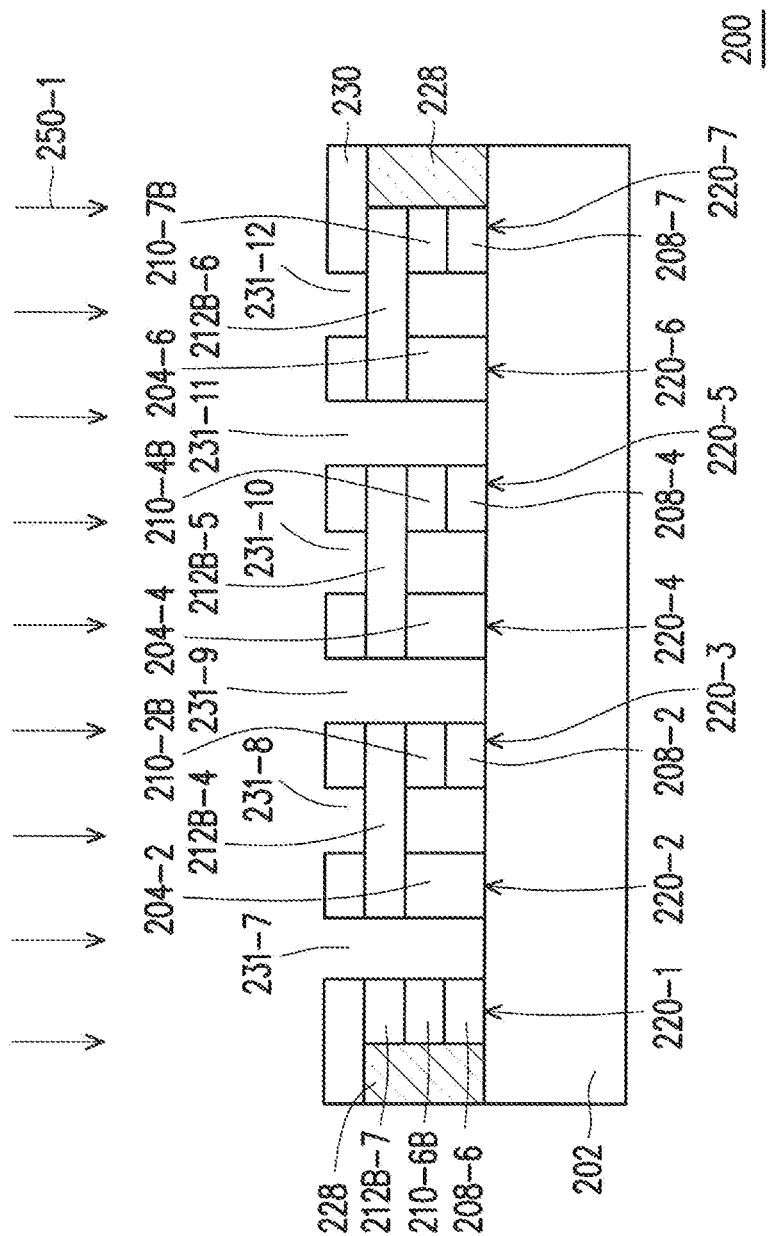
FIG. 4A illustrates a corresponding cross-sectional view of FIG. 2J when a first sub etching process is performed, in accordance with some embodiments.
Figure 4B:
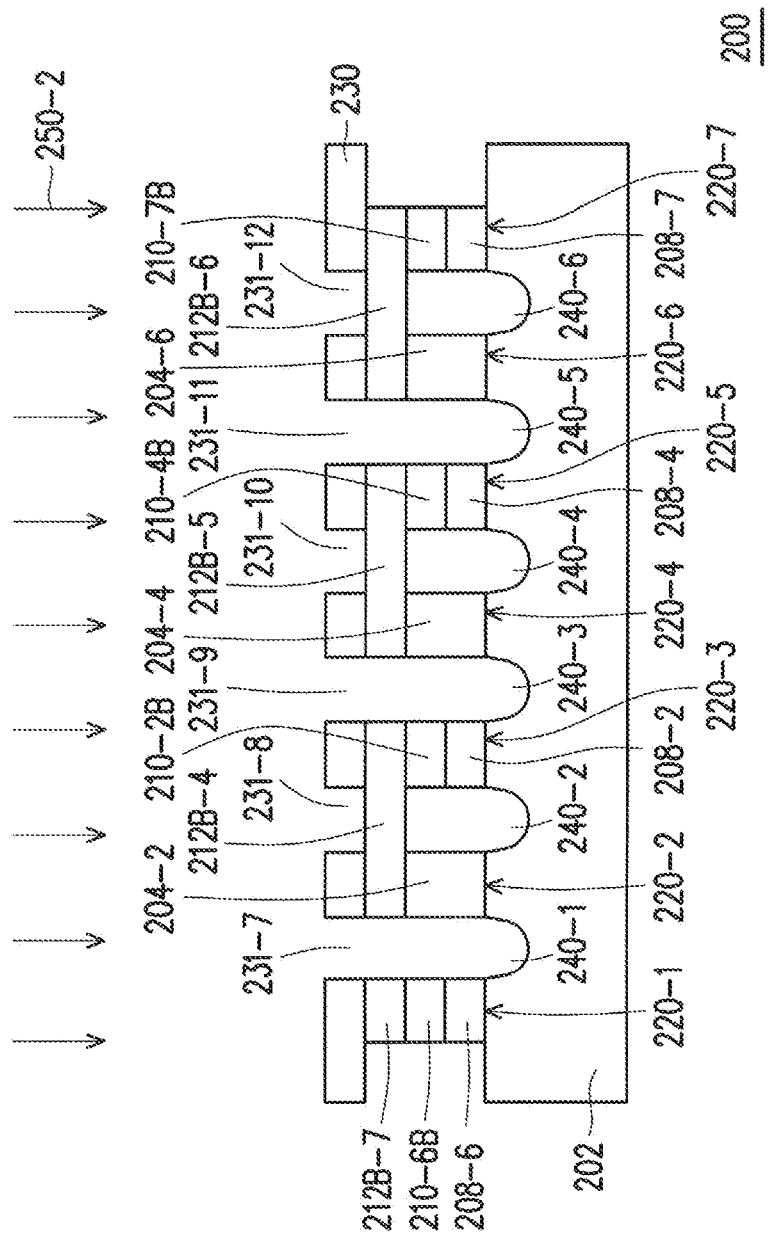
FIG. 4B illustrates a corresponding cross-sectional view of FIG. 2J when a second sub etching process is performed, in accordance with some embodiments.

As mentioned above, in some embodiments, the etching process 250 may include two sub processes, e.g., 250-1 and 250-2, performed to etch the dielectric layer 228 and recess a top portion of the substrate 202, respectively. FIGS. 4A and 4B respectively illustrate cross-sectional view of the thermocouple device 200, taken along line A-A (FIG. 2J), when the first sub process 250-1 and second sub-process 250-2 are performed. Referring to FIG. 4A, in some embodiments, the first sub process 250-1 is first performed that uses an anisotropic etching process (e.g., an inductively coupled plasma (ICP) process) to etch the dielectric layer 228 through respective openings (e.g., 231-7 to 231-12 as shown in FIG. 4A) of the patterned mask layer 230. The first sub process 250-1 may be configured to remove (e.g., etch) plural portions of the dielectric layer 228 that are disposed between respective thermoelectric conduction legs of the plural sub thermocouple devices.

For example, a portion of the dielectric layer 228 that is disposed between the thermoelectric conduction legs (208-6, 210-6B, and 212B-7) of the sub thermocouple device 220-1 and the thermoelectric conduction leg (204-2) of the sub thermocouple device 220-2 is etched by the first sub process 250-1 through the opening 231-7. Similarly, a portion of the dielectric layer 228 that is disposed between the thermoelectric conduction leg (204-2) of the sub thermocouple device 220-2 and the thermoelectric conduction legs (208-2 and 210-2B) of the sub thermocouple device 220-3 is etched by the first sub process 250-1 through the opening 231-8; a portion of the dielectric layer 228 that is disposed between the thermoelectric conduction legs (208-2 and 210-2B) of the sub thermocouple device 220-3 and the thermoelectric conduction leg (204-4) of the sub thermocouple device 220-4 is etched by the first sub process 250-1 through the opening 231-9; and so on. It is noted that a portion of the dielectric layer that are not exposed by the openings of the patterned mask layer 230 (e.g., portions of the dielectric layer 228 shown in FIG. 4A) may remain intact through the first sub process 250-1 due to the anisotropic characteristic of the first sub process 250-1.

Referring to FIG. 4B, in some embodiments, the second sub process 250-2 may be subsequently performed that uses an isotropic etching process (e.g., a reactive ion etching (RIE) process) to recess the top surface of the substrate 202. Due to the isotropic characteristic of the second sub process 250-2, remaining portions of the dielectric layer 228 can be removed, and further, the trenches (e.g., 240-1 to 240-6) between respective sub thermocouple devices (e.g., 220-1 to 220-7) can be formed. In some embodiments, each the trenches 240 may have an aspect ratio (width/depth) of about 0.2 to about 0.5. As mentioned above, the presence of the trenches 240 between respective sub thermocouple devices (220-1 to 220-7) can advantageously increase the respective level of the voltage/current signal generated by each of the sub thermocouple devices (220-1 to 220-7). After the at least two sub processes (250-1 and 250-2) of the etching process 250, the patterned mask layer 230 is removed.

In an embodiment, a semiconductor device is disclosed. The semiconductor device includes a substrate; a first thermoelectric conduction leg, disposed on the substrate, and doped with a first type of dopant; a second thermoelectric conduction leg, disposed on the substrate, and doped with a second type of dopant, wherein the first and second thermoelectric conduction legs are spatially spaced from each other but disposed along a common row on the substrate; and a first intermediate thermoelectric conduction structure, disposed on a first end of the second thermoelectric conduction leg, and doped with the first type of dopant.

Yet in another embodiment, a semiconductor device includes a substrate; a first thermocouple device, disposed along a first row on the substrate, comprising a first thermoelectric conduction leg, a second thermoelectric conduction leg, and a first contact structure coupling the first and second thermoelectric conduction legs via a first intermediate thermoelectric conduction structure; and a second thermocouple device, disposed along a second row on the substrate, comprising a third thermoelectric conduction leg, a fourth thermoelectric conduction leg, and a second contact structure coupling the third and fourth thermoelectric conduction legs via a second intermediate thermoelectric conduction structure.

Yet in another embodiment, a method includes forming a first thermoelectric conduction leg on a substrate; forming a second thermoelectric conduction leg on a substrate, wherein the second thermoelectric conduction leg is aligned with the first thermoelectric conduction leg along a same row; forming at least one intermediate thermoelectric conduction structure on an end of the second thermoelectric conduction leg; forming a contact structure coupling the first and second thermoelectric conduction legs via the at least one intermediate thermoelectric conduction structure; and recessing the substrate to form a trench substantially adjacent to a respective side edge of either the first thermoelectric conduction leg or the second thermoelectric conduction leg.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first thermoelectric conduction leg, disposed on the substrate, and doped with a first type of dopant;
   a second thermoelectric conduction leg, disposed on the substrate, and doped with a second type of dopant, wherein the first and second thermoelectric conduction legs are spatially spaced from each other but disposed along a common row on the substrate;
   a first intermediate thermoelectric conduction structure, disposed on a first end of the second thermoelectric conduction leg, and doped with the first type of dopant; and
   a second intermediate thermoelectric conduction structure that is disposed on a second end of the second thermoelectric conduction leg, and is doped with the first type of dopant, wherein the second end is opposite to the first end.

2. The device of claim 1, wherein the first type of dopant comprises an n-type of dopant, and the second type of dopant comprises a p-type of dopant.

3. The device of claim 1, wherein the first thermoelectric conduction leg comprises a polysilicon material, the second thermoelectric conduction leg comprises a silicon-germanium material, and the first intermediate thermoelectric conduction structure comprises the polysilicon material.

4. The device of claim 1, wherein the first end of the second thermoelectric conduction leg is substantially closer to the first thermoelectric conduction leg than the second end of the second thermoelectric conduction leg.

5. The device of claim 1, further comprising:
a first contact structure that is disposed on the first intermediate thermoelectric conduction structure and a first end of the first thermoelectric conduction leg.

6. The device of claim 5, further comprising:
a second contact structure that is disposed on a second end of the first thermoelectric conduction leg, wherein the second end is opposite to the first end.

7. The device of claim 1, further comprising:
a first trench disposed on a top surface of the substrate;
a second trench disposed on the top surface of the substrate; and
a support structure,
wherein the first and second trenches are substantially adjacent to respective side edges of the first and second thermoelectric conduction legs, and the support structure is disposed between the first and second thermoelectric conduction legs.

8. A semiconductor device, comprising:
a substrate;
a first thermocouple device, disposed along a first row on the substrate, comprising a first thermoelectric conduction leg, a second thermoelectric conduction leg, and a first contact structure coupling the first and second thermoelectric conduction legs via a first intermediate thermoelectric conduction structure;
a second thermocouple device, disposed along a second row on the substrate, comprising a third thermoelectric conduction leg, a fourth thermoelectric conduction leg, and a second contact structure coupling the third and fourth thermoelectric conduction legs via a second intermediate thermoelectric conduction structure; and
a third contact structure coupling the first thermoelectric conduction leg of the first thermocouple device and the third thermoelectric conduction leg of the second thermocouple device via a third intermediate thermoelectric conduction structure.

9. The device of claim 8, wherein the first and fourth thermoelectric conduction legs, and the first and second intermediate thermoelectric conduction structure are doped with a first type of dopant, and the second and third thermoelectric conduction legs are doped with a second type of dopant.

10. The device of claim 9, the first type of dopant comprises an n-type of dopant, and the second type of dopant comprises a p-type of dopant.

11. The device of claim 8, wherein the first and fourth thermoelectric conduction legs, and the first and second intermediate thermoelectric conduction structure each comprises a polysilicon material.

12. The device of claim 8, wherein the second and third thermoelectric conduction legs each comprises a silicon-germanium material.

13. The device of claim 8, wherein the third intermediate thermoelectric conduction structure is disposed on a first end of the third thermoelectric conduction leg of the second thermocouple device, and the second intermediate thermoelectric conduction structure is disposed on a second end of the third thermoelectric conduction leg of the second thermocouple device, the first and second ends being opposite to each other.

14. The device of claim 8, further comprising:
a first trench disposed on a top surface of the substrate that is located between the second thermoelectric conduction leg of the first thermocouple device and the fourth thermoelectric conduction leg of the second thermocouple device; and
a second trench disposed on the top surface of the substrate that is located between the first thermoelectric conduction leg of the first thermocouple device and the third thermoelectric conduction leg of the second thermocouple device.

15. The device of claim 8, wherein the first and fourth thermoelectric conduction legs each comprises a gate feature of a respective metal-oxide-semiconductor field-effect-transistor (MOSFET), and the second and third thermoelectric conduction legs each comprises a base feature of a respective bipolar junction transistor (BJT).

16. The device of claim 8, wherein the first and second intermediate thermoelectric conduction structure each comprises an emitter feature of a respective bipolar junction transistor (BJT).

17. A semiconductor device, comprising:
a substrate;
a first thermoelectric conduction leg, disposed on the substrate, and doped with a first type of dopant;
a second thermoelectric conduction leg, disposed on the substrate, and doped with a second type of dopant, wherein the first and second thermoelectric conduction legs are spatially spaced from each other but disposed along a common row on the substrate;
a first intermediate thermoelectric conduction structure, disposed on a first end of the second thermoelectric conduction leg, and doped with the first type of dopant;
a second intermediate thermoelectric conduction structure that is disposed on a second end of the second thermoelectric conduction leg, and is doped with the first type of dopant, wherein the second end is opposite to the first end;
a first trench disposed on a top surface of the substrate;
a second trench disposed on the top surface of the substrate; and
a support structure, wherein the first and second trenches are substantially adjacent to respective side edges of the first and second thermoelectric conduction legs, and the support structure is disposed between the first and second thermoelectric conduction legs.

18. The device of claim 17, wherein the first type of dopant comprises an n-type of dopant, and the second type of dopant comprises a p-type of dopant.

19. The device of claim 17, wherein the first thermoelectric conduction leg comprises a polysilicon material, the second thermoelectric conduction leg comprises a silicon-germanium material, and the first intermediate thermoelectric conduction structure comprises the polysilicon material.

20. The device of claim 17, wherein the first end of the second thermoelectric conduction leg is substantially closer to the first thermoelectric conduction leg than the second end of the second thermoelectric conduction leg.

* * * * *